(12) United States Patent
Alexander et al.

(10) Patent No.: US 9,299,555 B1
(45) Date of Patent: Mar. 29, 2016

(54) ULTRAPURE MINERALIZERS AND METHODS FOR NITRIDE CRYSTAL GROWTH

(71) Applicant: SORAA, INC., Fremont, CA (US)

(72) Inventors: Alex Alexander, Santa Barbara, CA (US); John W. Nink, Jr., Santa Barbara, CA (US); Mark P. D'Evelyn, Santa Barbara, CA (US)

(73) Assignee: Soraa, Inc., Fremont, CA (US)

(*) Notice: Subject to any disclaimer, the term of this patent is extended or adjusted under 35 U.S.C. 154(b) by 368 days.

(21) Appl. No.: 14/033,107

(22) Filed: Sep. 20, 2013

Related U.S. Application Data

(60) Provisional application No. 61/707,689, filed on Sep. 28, 2012.

(51) Int. Cl.
| | |
|---|---|
| *C30B 9/12* | (2006.01) |
| *H01L 21/02* | (2006.01) |
| *C30B 7/10* | (2006.01) |
| *C30B 9/04* | (2006.01) |
| *C30B 9/08* | (2006.01) |
| *C30B 29/38* | (2006.01) |

(52) U.S. Cl.
CPC .......... *H01L 21/02005* (2013.01); *C30B 7/105* (2013.01); *C30B 9/04* (2013.01); *C30B 9/08* (2013.01); *C30B 9/12* (2013.01); *C30B 29/38* (2013.01)

(58) Field of Classification Search
CPC ............ C30B 29/38; C30B 9/04; C30B 9/08; C30B 9/12
See application file for complete search history.

(56) References Cited

U.S. PATENT DOCUMENTS

| | | | |
|---|---|---|---|
| 4,030,966 | A | 6/1977 | Hornig et al. |
| 4,066,868 | A | 1/1978 | Witkin et al. |
| 4,350,560 | A | 9/1982 | Helgeland et al. |
| 4,870,045 | A | 9/1989 | Gasper et al. |
| 5,098,673 | A | 3/1992 | Engel et al. |
| 5,169,486 | A | 12/1992 | Young et al. |
| 6,129,900 | A | 10/2000 | Satoh et al. |
| 6,273,948 | B1 | 8/2001 | Porowski et al. |
| 6,398,867 | B1 | 6/2002 | D'Evelyn et al. |
| 6,406,540 | B1 | 6/2002 | Harris et al. |
| 6,528,427 | B2 | 3/2003 | Chebi et al. |
| 6,596,079 | B1 | 7/2003 | Vaudo et al. |
| 6,656,615 | B2 | 12/2003 | Dwilinski et al. |

(Continued)

FOREIGN PATENT DOCUMENTS

| | | |
|---|---|---|
| CN | 101061570 | 10/2007 |
| JP | 2005-289797 | 10/2005 |

(Continued)

OTHER PUBLICATIONS

USPTO Office Action for U.S. Appl. No. 13/600,191 dated Mar. 11, 2015 (9 pages).

(Continued)

*Primary Examiner* — Robert M Kunemund
(74) *Attorney, Agent, or Firm* — Saul Ewing LLP

(57) ABSTRACT

An ultrapure mineralizer is formed by vaporization, condensation, and delivery of a condensable mineralizer composition. The mineralizer has an oxygen content below 100 parts per million. The ultrapure mineralizer is useful as a raw material for ammonothermal growth of bulk group III metal nitride crystals.

20 Claims, 3 Drawing Sheets

(56) References Cited

U.S. PATENT DOCUMENTS

| | | |
|---|---|---|
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,861,130 B2 | 3/2005 | D'Evelyn et al. |
| 6,887,144 B2 | 5/2005 | D'Evelyn et al. |
| 7,001,577 B2 | 2/2006 | Zimmerman et al. |
| 7,026,756 B2 | 4/2006 | Shimizu et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,252,712 B2 | 8/2007 | Dwilinski et al. |
| 7,279,040 B1 | 10/2007 | Wang |
| 7,316,746 B2 | 1/2008 | D'Evelyn et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,470,938 B2 | 12/2008 | Lee et al. |
| 7,569,206 B2 | 8/2009 | Spencer et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,180 B2 | 4/2012 | Felker et al. |
| 8,148,801 B2 | 4/2012 | D'Evelyn |
| 8,278,656 B2 | 10/2012 | Mattmann et al. |
| 8,303,710 B2 | 11/2012 | D'Evelyn |
| 8,306,081 B1 | 11/2012 | Schmidt et al. |
| 8,313,964 B2 | 11/2012 | Sharma et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,802,471 B1 | 8/2014 | Cich et al. |
| 2001/0011935 A1 | 8/2001 | Lee et al. |
| 2002/0155691 A1 | 10/2002 | Lee et al. |
| 2002/0189532 A1 | 12/2002 | Motoki et al. |
| 2003/0027014 A1 | 2/2003 | Johnson et al. |
| 2003/0127041 A1 | 7/2003 | Xu et al. |
| 2003/0128041 A1 | 7/2003 | Byrd |
| 2003/0138732 A1 | 7/2003 | Nagase |
| 2003/0140845 A1 | 7/2003 | D'Evelyn et al. |
| 2003/0145784 A1 | 8/2003 | Thompson et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2005/0087753 A1 | 4/2005 | D'Evelyn et al. |
| 2005/0098095 A1 | 5/2005 | D'Evelyn et al. |
| 2005/0128469 A1 | 6/2005 | Hall et al. |
| 2005/0152820 A1 | 7/2005 | D'Evelyn et al. |
| 2005/0205215 A1 | 9/2005 | Giddings et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0048699 A1 | 3/2006 | D'Evelyn et al. |
| 2006/0096521 A1 | 5/2006 | D'Evelyn et al. |
| 2006/0124051 A1 | 6/2006 | Yoshioka et al. |
| 2006/0177362 A1 | 8/2006 | D'Evelyn et al. |
| 2006/0207497 A1 | 9/2006 | D'Evelyn et al. |
| 2006/0288927 A1 | 12/2006 | Chodelka et al. |
| 2007/0057337 A1 | 3/2007 | Kano et al. |
| 2007/0105351 A1 | 5/2007 | Motoki et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0218703 A1 | 9/2007 | Kaeding et al. |
| 2007/0231978 A1 | 10/2007 | Kanamoto et al. |
| 2007/0252164 A1 | 11/2007 | Zhong et al. |
| 2007/0264733 A1 | 11/2007 | Choi et al. |
| 2007/0274359 A1 | 11/2007 | Takeuchi et al. |
| 2008/0006831 A1 | 1/2008 | Ng |
| 2008/0025360 A1 | 1/2008 | Eichler et al. |
| 2008/0056984 A1 | 3/2008 | Yoshioka et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0096470 A1 | 4/2008 | Hou et al. |
| 2008/0156254 A1 | 7/2008 | Dwilinski et al. |
| 2008/0193363 A1 | 8/2008 | Tsuji |
| 2009/0092536 A1 | 4/2009 | Kawabata et al. |
| 2009/0140287 A1 | 6/2009 | Fujiwara et al. |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0243988 A1 | 9/2010 | Kamikawa et al. |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0124139 A1 | 5/2011 | Chang |
| 2011/0158275 A1 | 6/2011 | Yoshizumi et al. |
| 2011/0183498 A1 | 7/2011 | D'Evelyn |
| 2011/0186860 A1 | 8/2011 | Enya et al. |
| 2011/0220912 A1 | 9/2011 | D'Evelyn |
| 2011/0256693 A1 | 10/2011 | D'Evelyn et al. |
| 2011/0260189 A1 | 10/2011 | Kim |
| 2011/0309373 A1 | 12/2011 | Sharma et al. |
| 2012/0000415 A1 | 1/2012 | D'Evelyn et al. |
| 2012/0091465 A1 | 4/2012 | Krames et al. |
| 2012/0104359 A1 | 5/2012 | Felker et al. |
| 2012/0104412 A1 | 5/2012 | Zhong et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2013/0112987 A1 | 5/2013 | Fu et al. |

(56) References Cited

U.S. PATENT DOCUMENTS

| | | | |
|---|---|---|---|
| 2013/0119401 | A1 | 5/2013 | D'Evelyn et al. |
| 2013/0126902 | A1 | 5/2013 | Isozaki et al. |
| 2013/0251615 | A1 | 9/2013 | D'Evelyn et al. |
| 2013/0323490 | A1 | 12/2013 | D'Evelyn et al. |
| 2014/0050244 | A1 | 2/2014 | Ohno et al. |
| 2014/0065360 | A1 | 3/2014 | D'Evelyn et al. |
| 2014/0147650 | A1 | 5/2014 | Jiang et al. |

FOREIGN PATENT DOCUMENTS

| | | |
|---|---|---|
| WO | WO 2006/057463 | 1/2006 |
| WO | WO 2006/038467 | 4/2006 |
| WO | WO 2007/004495 | 1/2007 |
| WO | WO 2010/068916 | 6/2010 |
| WO | WO 2011/044554 | 4/2011 |
| WO | WO 2012/016033 | 2/2012 |

OTHER PUBLICATIONS

USPTO Office Action for U.S. Appl. No. 12/133,365 dated Feb. 20, 2014, 32 pages.
USPTO Office Action for U.S. Appl. No. 12/636,683 dated Feb. 24, 2014, 16 pages.
USPTO Notice of Allowance for U.S. Appl. No. 13/272,981 dated Mar. 13, 2014, 10 pages.
Aguilar, 'Ohmic n-contacts to Gallium Nitride Light Emitting Diodes', National Nanotechnologhy Infrastructure Network, 2007, p. 56-81.
Lu et al., 'Etch-Pits of GaN Films with Different Etching Methods', Journal of the Korean Physical Society, vol. 45, Dec. 2004, p. S673-S675.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
USPTO Office Action for U.S. Appl. No. 13/723,968 dated Nov. 29, 2013 (23 pages).
USPTO Notice of Allowance for U.S. Appl. No. 13/723,968 dated Apr. 28, 2014 (8 pages).
Altoukhov et al., 'High reflectivity airgap distributed Bragg reflectors realized by wet etching of AlInN sacrificial layers', Applied Physics Letters, vol. 95, 2009, p. 191102-1-3.
Callahan et al., 'Synthesis and Growth of Gallium Nitride by the Chemical Vapor Reaction Process (CVRP)', MRS Internet Journal Nitride Semiconductor Research', vol. 4, No. 10, 1999, p. 1-6.
Choi et al., '2.51 microcavity InGaN light-emitting diodes fabricated by a selective dry-etch thinning process', Applied Physics Letters, 2007, 91(6), 061120.
Copel et al., 'Surfactants in Epitaxial Growth', Physical Review Letters, Aug. 7, 1989, vol. 63, No. 6, p. 632-635.
D'Evelyn et al., 'Bulk GaN Crystal Growth by the High-Pressure Ammonothermal Method', Journal of Crystal Growth, vol. 300, 2007, p. 11-16.
Dorsaz et al., 'Selective oxidation of AlInN Layers for current confinement III-nitride devices', Applied Physics Letters, vol. 87, 2005, p. 072102.
Ehrentraut et al., 'The ammonothermal crystal growth of gallium nitride-A technique on the up rise', Proceedings IEEE, 2010, 98(7), p. 1316-1323.
Fang., 'Deep centers in semi-insulating Fe-doped native GaN substrates grown by hydride vapour phase epitaxy', Physica Status Solidi, vol. 5, No. 6, 2008, p. 1508-1511.

Fujito et al., 'Development of Bulk GaN Crystals and Nonpolar/Semipolar Substrates by HVPE', MRS Bulletin, May 2009, vol. 34, No. 5, p. 313-317.
Fukuda et al., 'Prospects for the Ammonothermal Growth of Large GaN Crystal', Journal of Crystal Growth, vol. 305, 2007, p. 304-310.
Gladkov et al., 'Effect of Fe doping on optical properties of freestanding semi-insulating HVPE GaN:Fe', Journal of Crystal Growth, 312, 2010, p. 1205-1209.
Grzegory, 'High pressure growth of bulk GaN from Solutions in gallium', Journal of Physics Condensed Matter, vol. 13, 2001, p. 6875-6892.
Lide et al., 'Thermal Conductivity of Ceramics and Other Insulating Materials', CRC Handbook of Chemistry and Physics, 91st Edition, 2010-2011, p. 12-203 and 12-204.
Lu et al., 'Structure of the Cl-passivated GaAs(111) surface', Physical Review B, Nov. 15, 1998, vol. 58, No. 20, p. 13820-13823.
Massies et al., 'Surfactant mediated epitaxial growth of InxGal-xAs on GaAs (001)', Applied Physics Letters, vol. 61, No. 1, Jul. 6, 1992, p. 99-101.
http://www.matbase.com/material/non-ferrous-metals/other/molybdenum/properties, Data Table for: Non-Ferrous Metals: Other Metals: Molybdenum, Mar. 28, 2011, pp. 1.
Moutanabbir, 'Bulk GaN Ion Cleaving', Journal of Electronic Materials, vol. 39, 2010, p. 482-488.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, p. 103509-1-103509-4.
Pattison et al., 'Gallium Nitride Based Microcavity Light Emitting Diodes With 2? Effective Cavity Thickness', Applied Physics Letters, vol. 90, Issue 3, 031111, 2007, 3 pages.
International Search Report & Written Opinion of PCT Application No. PCT/US2009/067745, dated Feb. 5, 2010, 9 pages.
Porowski, 'High Resistivity GaN Single Crystalline Substrates', Acta Physica Polonica A, vol. 92, No. 2, 1997, p. 958-962.
Porowski, 'Near Defect Free GaN Substrates', Journal of Nitride Semiconductor, 1999, p. 1-11.
Sarva et al., 'Dynamic Compressive Strength of Silicon Carbide Under Uniaxial Compression', Material Sciences and Engineering, vol. A317, 2001, p. 140-144.
Sharma et al., 'Vertically Oriented GaN-based air-gap distributed Bragg reflector structure fabricated using band-gap-selective photoelectrochemical etching', Applied Physics Letters, vol. 87, 2005, p. 051107.
Sumiya et al., 'High-pressure synthesis of high-purity diamond crystal', Diamond and Related Materials, 1996, vol. 5, p. 1359-1365.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, 2009, p. 251905.
Communication from the Polish Patent Office re P394857 dated Jan. 22, 2013, 2 pages.
Communication from the Chinese Patent Office re 200980134876.2 dated Jul. 3, 2013, 14 pages.
Communication from the Polish Patent Office re P394857 dated Aug. 14, 2013, 2 pages.
Wang et al , 'Ammonothermal Growth of GaN Crystals in Alkaline Solutions', Journal of Crystal Growth, vol. 287, 2006, p. 376-380.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, 2004, p. 1-19.
USPTO Office Action for U.S. Appl. No. 12/133,364 dated Nov. 26, 2010 (5 pages).
USPTO Office Action for for U.S. Appl. No. 12/133,364 dated Jun. 1, 2011 (7 pages).
USPTO Notice of Allowance for for U.S. Appl. No. 12/133,364 dated Oct. 11, 2011 (5 pages).
USPTO Office Action for for U.S. Appl. No. 12/133,365 dated Jun. 9, 2011 (16 pages).
USPTO Office Action for for U.S. Appl. No. 12/133,365 dated Oct. 18, 2011 (21 pages).

(56) References Cited

OTHER PUBLICATIONS

USPTO Office Action for for U.S. Appl. No. 12/133,365 dated May 13, 2013 (22 pages).
USPTO Office Action for for U.S. Appl. No. 12/133,365 dated Aug. 21, 2013 (28 pages).
USPTO Office Action for for U.S. Appl. No. 12/334,418 dated Apr. 5, 2011 (19 pages).
USPTO Office Action for for U.S. Appl. No. 12/334,418 dated Oct. 19, 2011 (23 pages).
USPTO Office Action for for U.S. Appl. No. 12/334,418 dated Sep. 17, 2013 (26 pages).
USPTO Office Action for U.S. Appl. No. 12/478,736 dated Sep. 27, 2011 (10 pages).
USPTO Office Action for U.S. Appl. No. 12/478,736 dated Feb. 7, 2012 (6 pages).
USPTO Notice of Allowance for U.S. Appl. No. 12/478,736 dated Apr. 23, 2012 (7 pages).
USPTO Notice of Allowance for U.S. Appl. No. 12/478,736 dated Oct. 9, 2012 (4 pages).
USPTO Office Action for U.S. Appl. No. 12/484,095 dated Nov. 10, 2010 (8 pages).
USPTO Office Action for U.S. Appl. No. 12/484,095 dated Jul. 8, 2011 (11 pages).
USPTO Office Action for U.S. Appl. No. 12/497,969 dated Feb. 2, 2012 (19 pages).
USPTO Office Action for U.S. Appl. No. 12/497,969 dated Jul. 5, 2012 (17 pages).
USPTO Office Action for U.S. Appl. No. 12/497,969 dated May 16, 2013 (21 pages).
USPTO Office Action for U.S. Appl. No. 12/497,969 dated Sep. 6, 2013 (20 pages).
USPTO Office Action for U.S. Appl. No. 12/534,843 dated Sep. 10, 2012 (9 pages).
USPTO Notice of Allowance for U.S. Appl. No. 12/534,843 dated Jan. 24, 2013 (8 pages).
USPTO Office Action for U.S. Appl. No. 12/534,844 dated Sep. 16, 2010 (8 pages).
USPTO Office Action for U.S. Appl. No. 12/534,844 dated Feb. 4, 2011 (9 pages).
USPTO Notice of Allowance for U.S. Appl. No. 12/534,849 dated Jul. 31, 2012 (11 pages).
USPTO Office Action for U.S. Appl. No. 12/534,857 dated Sep. 1, 2010 (10 pages).
USPTO Notice of Allowance for U.S. Appl. No. 12/534,857 dated May 27, 2011 (5 pages).
USPTO Office Action for U.S. Appl. No. 12/546,458 dated Jul. 20, 2011 (4 pages).
USPTO Notice of Allowance for U.S. Appl. No. 12/546,458 dated Nov. 28, 2011 (5 pages).
USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (5 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (18 pages).
USPTO Notice of Allowance for U.S. Appl. No. 12/569,337 dated Nov. 15, 2012 (5 pages).
Uspto Office Action for U.S. Appl. No. 12/569,844 dated Oct. 12, 2012 (12 pages).
Uspto Office Action for U.S. Appl. No. 12/634,665 dated Apr. 25, 2012 (10 pages).
Uspto Office Action for U.S. Appl. No. 12/634,665 dated Oct. 1, 2012 (10 pages).
USPTO Notice of Allowance for U.S. Appl. No. 12/634,665 dated Feb. 15, 2013 (9 pages).
USPTO Office Action for U.S. Appl. No. 12/636,683 dated Jun. 12, 2013 (14 pages).
USPTO Office Action for U.S. Appl. No. 12/636,683 dated Aug. 16, 2013 (16 pages).
USPTO Office Action for U.S. Appl. No. 12/697,171 dated Jun. 20, 2013 (16 pages).
USPTO Office Action for U.S. Appl. No. 12/697,171 dated Aug. 20, 2013 (17 pages).
USPTO Office Action for U.S. Appl. No. 12/724,983 dated Mar. 5, 2012 (20 pages).
USPTO Office Action for U.S. Appl. No. 12/785,404 dated Mar. 6, 2012 (9 pages).
USPTO Notice of Allowance for U.S. Appl. No. 12/785,404 dated Jul. 16, 2012 (5 pages).
USPTO Office Action for U.S. Appl. No. 12/891,668 dated Sep. 25, 2012 (20 pages).
USPTO Office Action for U.S. Appl. No. 12/891,668 dated Jan. 10, 2013 (30 pages).
USPTO Notice of Allowance for U.S. Appl. No. 12/891,668 dated Mar. 20, 2013 (13 pages).
USPTO Office Action for U.S. Appl. No. 13/025,833 dated Jul. 12, 2012 (15 pages).
USPTO Office Action for U.S. Appl. No. 13/041,199 dated Nov. 30, 2012 (13 pages).
USPTO Office Action for U.S. Appl. No. 13/041,199 dated Mar. 12, 2013 (9 pages).
USPTO Office Action for U.S. Appl. No. 13/175,739 dated Dec. 7, 2012 (5 pages).
USPTO Notice of Allowance for U.S. Appl. No. 13/175,739 dated Mar. 21, 2013 (6 pages).
USPTO Office Action for U.S. Appl. No. 13/179,346 dated Dec. 13, 2012 (20 pages).
USPTO Office Action for U.S. Appl. No. 13/226,249 dated Oct. 10, 2012 (7 pages).
USPTO Notice of Allowance for U.S. Appl. No. 13/226,249 dated Feb. 21, 2013 (5 pages).
USPTO Office Action for U.S. Appl. No. 13/272,981 dated Mar. 20, 2013 (18 pages).
USPTO Office Action for U.S. Appl. No. 13/272,981 dated Aug. 15, 2013 (13 pages).
USPTO Office Action for U.S. Appl. No. 13/346,507 dated Dec. 21, 2012 (8 pages).
USPTO Notice of Allowance for U.S. Appl. No. 13/346,507 dated Apr. 22, 2013 (8 pages).
USPTO Notice of Allowance for U.S. Appl. No. 13/425,304 dated Aug. 22, 2012 (7 pages).
USPTO Office Action for U.S. Appl. No. 13/472,356 dated Dec. 9, 2013 (11 pages).
USPTO Notice of Allowance for U.S. Appl. No. 13/548,931 dated Jun. 3, 2013 (10 pages).

Hydrogen Fluoride Fill Station
Lab Scale and Production Scale

ULTRAPURE MINERALIZERS AND METHODS FOR NITRIDE CRYSTAL GROWTH

This application claims the benefit under 35 U.S.C. §119 (e) of U.S. Provisional Application No. 61/707,689 filed on Sep. 28, 2012, which is incorporated by referenced in its entirety.

GOVERNMENT LICENSE RIGHTS

This disclosure was made with government support under Grant IIP-1026896, awarded by the U.S. National Science Foundation. The government has certain rights in the disclosure.

BACKGROUND OF THE DISCLOSURE

The present disclosure generally relates to processing of materials for growth of crystals. More particularly, the present disclosure provides a mineralizer suitable for use as a raw material for crystal growth of a group III metal nitride crystal by an ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

Gallium nitride containing crystalline materials serve as substrates for manufacture of conventional optoelectronic devices, such as blue light emitting diodes and lasers. Such optoelectronic devices have been commonly manufactured on sapphire or silicon carbide substrates that differ in composition from the deposited nitride layers. In the conventional Metal-Organic Chemical Vapor Deposition (MOCVD) method, deposition of GaN is performed from ammonia and organometallic compounds in the gas phase. Although successful, conventional growth rates achieved make it difficult to provide a bulk layer of GaN material. Additionally, dislocation densities are also high and lead to poorer optoelectronic device performance.

Growth of nitride crystals by ammonothermal synthesis has been proposed. Ammonothermal crystal growth methods are expected to be scalable, as described by Dwilinski, et al, *J. Crystal Growth* 310, 3911 (2008), by Ehrentraut, et al., *J. Crystal Growth* 305, 204 (2007)], by D'Evelyn, et al. *J. Crystal Growth* 300, 11 (2007), and by Wang, et al., *Crystal Growth & Design* 6, 1227 (2006). The ammonothermal method generally requires a mineralizer, which chemically reacts with a polycrystalline source material to form a soluble intermediate that is transported in a supercritical fluid and is then recrystallized onto seed crystals. An ongoing challenge of ammonothermally-grown GaN crystals is a significant level of impurities, which cause the crystals to be colored, e.g., yellowish, greenish, grayish, or brownish. The residual impurities may cause optical absorption in light emitting diodes fabricated on such substrates, negatively impacting efficiency, and may also degrade the electrical conductivity and/or generate stresses within the crystals. One potential source of the impurities is the mineralizer.

A number of mineralizers have been proposed for ammonothermal growth of crystalline group III nitrides. These include alkali metals; alkali imide, imido-amide, amide, nitride, hydride, or azide; an alkaline earth metal, imide, imido-amide, amide, nitride, hydride, or azide; ammonium halide, a group III metal halide, or a reaction product between a group III metal, ammonia, and hydrogen halide. Most of these mineralizers are highly hygroscopic and/or moisture sensitive, with the consequence that it is rather difficult to achieve low levels of oxygen impurity. For ammonobasic mineralizer chemistry, Dwilinski, et al. (U.S. Pat. No. 7,364,619) proposed the use of azides, which are commercially available and are less hygroscopic and therefore easier to purify than the corresponding amides or nitrides. However, azides have the disadvantage of being chemically unstable and may decompose to form excess nitrogen gas under typical ammonothermal conditions. For ammonoacidic chemistry, ammonium chloride and ammonium fluoride are commercially available, with purity specifications above 99.99% on a trace metals basis (that is, the impurity levels of oxygen and moisture are not specified). Ammonoacidic mineralizers, including mineralizers containing fluoride, may offer certain advantages over ammonobasic mineralizers. Stepin, et al., *(Poluch. Anal. Vestchestv. Osoboi Chist.,* $5^{th}$, 91-94 (1978)) suggested forming $NH_4Cl$ from HCl and $NH_3$, and Naumova, et al. (*Zh. Prikh. Khim.* 52, 249 (1979)) suggested purifying $NH_4Cl$ by sublimation. However, to the best of our knowledge, none of these authors specified the oxygen impurity levels that were achievable by these methods.

Mikawa et al. (U.S. Application Publication No. 2011/0268645) disclosed formation of ultrapure ammonium halides by reaction of ultrapure hydrogen halide with ultrapure ammonia and their use as a mineralizer for ammonothermal gallium nitride crystal growth. However, the methods disclosed by Mikawa et al. are not well suited for working with a condensable hydrogen halide such as HF, useful for synthesizing fluoride-containing mineralizers.

What is needed is a method for low-cost manufacturing of fluoride-containing mineralizers that are suitable for crystal growth of bulk gallium nitride crystals and do not contribute to impurities in the bulk crystals.

BRIEF SUMMARY OF THE DISCLOSURE

According to the present disclosure, techniques related to processing of materials for growth of crystals are provided. More particularly, the present disclosure provides a mineralizer suitable for use as a raw material for crystal growth of a group III metal nitride crystal by an ammonobasic or ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

In a specific embodiment, the present disclosure provides a mineralizer composition. The mineralizer includes one or more compositions comprising fluorine, including hydrogen fluoride (HF), ammonium fluoride ($NH_4F$), ammonium acid fluoride ($NH_5F_2$), gallium fluoride ($GaF_3$) and its diammine complex ($GaF_3 \cdot 2NH_3$), and hexafluoroammonium gallate (($NH_4)_3GaF_6$). In certain embodiments, the mineralizer comprises a composition comprising two or more of fluorine (F), hydrogen (H), nitrogen (N), and gallium (Ga), or a reaction product between a metal, ammonia, and a hydrogen fluoride or a reaction product between two or more of the compositions. The mineralizer may have a total oxygen content in the mineralizer composition less than about 100 parts per million (ppm) by weight.

A mineralizer composition comprising at least one of fluorine and at least one of chlorine, bromine, or iodine is provided in other embodiments.

Moreover, the present disclosure provides a method for forming a gallium nitride crystal structure. The method includes providing a purified mineralizer substantially free from trace impurities to an autoclave or a capsule along with ammonia and a polycrystalline group III nitride source material, the trace impurities being less than about 1000 ppm. The method includes processing the polycrystalline group III nitride in supercritical ammonia at a temperature greater than 400 degrees Celsius and a pressure greater than 50 MPa to cause formation of one or more crystalline structures being substantially transparent in characteristic. In certain embodiments, the crystalline structures have high purity and are transparent. The crystalline structures may be processed to form one or more group III metal nitride wafers. The group III metal nitride wafers may be used as substrates for devices such as light emitting diodes (LEDs), laser diodes, power diodes, and transistors.

Benefits are achieved over pre-existing techniques using the present disclosure. In particular, the present disclosure enables a cost-effective growth of crystals such as GaN, AlN, InN, InGaN, and AlInGaN and others. In a specific embodiment, the present method and resulting composition can be made using relatively simple and cost effective techniques and apparatus. In a specific embodiment, the resulting mineralizer is substantially pure and can be a starting point for high purity crystals and the like. Depending upon the embodiment, one or more of these benefits may be achieved. These and other benefits may be described throughout the present specification and more particularly below.

The present disclosure achieves these benefits and others in the context of known process technology. However, a further understanding of the nature and advantages of the present disclosure may be realized by reference to the latter portions of the specification and attached drawings.

DETAILED DESCRIPTION OF THE DISCLOSURE

Figure 1:
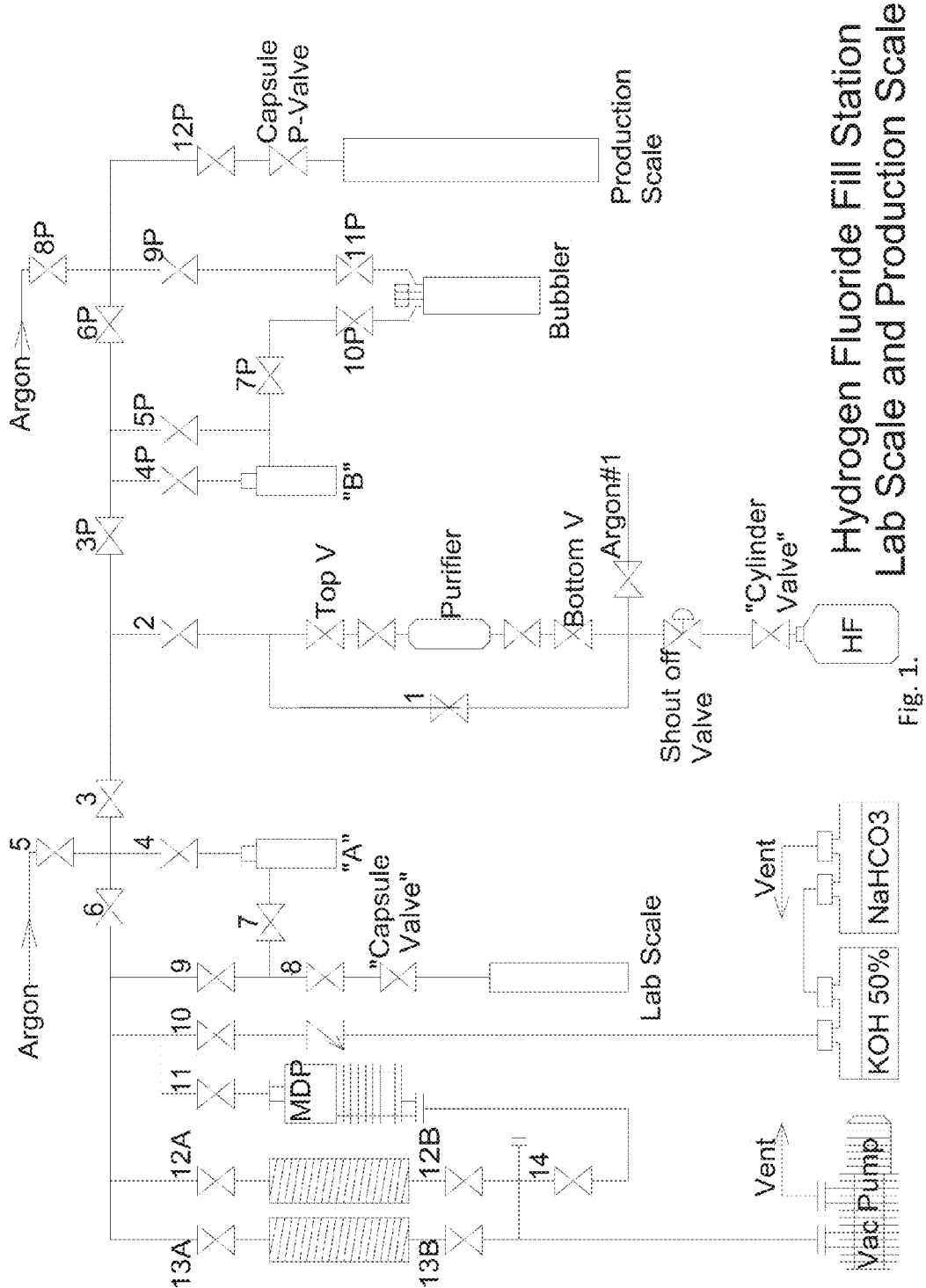
FIG. 1 is a schematic diagram of a system for delivery of a condensable mineralizer composition according to an embodiment of the present disclosure.

According to the present disclosure, techniques related to processing of materials for growth of crystals are provided. More particularly, the present disclosure provides a high purity mineralizer suitable for use as a raw material for crystal growth of a group III metal nitride crystal by an ammonoacidic technique, but there can be others. In other embodiments, the present disclosure provides methods suitable for synthesis of crystalline nitride materials, but it would be recognized that other crystals and materials can also be processed. Such crystals and materials include, but are not limited to, GaN, AlN, InN, BN, InGaN, AlGaN, AlInGaN, and BAlGaInN, and others for manufacture of bulk or patterned substrates. Such bulk or patterned substrates can be used for a variety of applications including optoelectronic devices, lasers, light emitting diodes, solar cells, photoelectrochemical water splitting and hydrogen generation, photodetectors, integrated circuits, and transistors, among other devices.

The disclosure includes embodiments that may relate to a composition. The disclosure includes embodiments that may relate to an apparatus for making a composition. The disclosure includes embodiments that may relate to a method of making and/or using the composition.

Approximating language, as used herein throughout the specification and claims, may be applied to modify any quantitative representation that could permissibly vary without resulting in a change in the basic function to which it may be related. Accordingly, a value modified by a term such as "about" may be not to be limited to the precise value specified. In at least one instance, the variance indicated by the term about may be determined with reference to the precision of the measuring instrumentation. Similarly, "free" may be combined with a term; and, may include an insubstantial number, or a trace amount, while still being considered free of the modified term unless explicitly stated otherwise.

In a specific embodiment, the present disclosure provides a mineralizer composition. The mineralizer includes one or more compositions comprising fluorine, including hydrogen fluoride (HF), ammonium fluoride ($NH_4F$), ammonium acid fluoride ($NH_5F_2$), gallium fluoride ($GaF_3$) and its diammine complex ($GaF_3 \cdot 2NH_3$), and hexafluoroammonium gallate (($NH_4)_3GaF_6$). In certain embodiments, the mineralizer comprises a composition comprising two or more of fluorine (F), hydrogen (H), nitrogen (N), and gallium (Ga), or a reaction product between a metal, ammonia, and a hydrogen fluoride or a reaction product between two or more of the compositions. In certain embodiments, a condensable mineralizer composition comprises one or more of $GaCl_3$, $GaBr_3$, and $GaI_3$. The mineralizer may have a total oxygen content in the mineralizer composition less than about 100 parts per million (ppm) by weight, less than about 10 ppm, less than about 5 ppm, less than about 2 ppm, or less than about 1 ppm.

Referring to FIG. 1, a manifold for delivery of a condensable mineralizer composition is provided. The manifold may comprise a number of valves, tubulation, at least one vacuum pump, one or more traps in series with the at least one vacuum pump, connections to a purge gas, connections to exhaust traps, one or more point-of-use purifiers, one or more transfer vessels into which a condensable mineralizer composition may be condensed, and one or more receiving vessels into which the condensable mineralizer may be delivered. The tubulation and valves for the manifold may comprise stainless steel or a more corrosion-resistant alloy such as Hastalloy®. The tubulation, valves, and other components may be connected by leak-tight fittings. The leak-tight fittings may comprise metal seals, knife-edge-gasket metal seals, rounded-edge-gasket metal seals, O-ring seals, ferrule seals, a combination thereof, or the like. The valves may comprise non-bonnet-type seals to atmosphere such as bellows or diaphragm seals and through-seals comprising a polymer such as Kel-F or polyimide. In certain embodiments, some tubulation, valves, and/or other components, are fabricated from a plastic such as PFA Teflon®, poly(ethylene-co-tetrafluoroethylene) (ETFE), or the like. In certain embodiments, the manifold is contained within a ventilated enclosure for safety in case of a leak. In certain embodiments, the pump contains a corrosion-resistant fluid such as Krytox®.

The at least one vacuum pump may comprise a conventional rotary oil pump. In other embodiments, the vacuum pump comprises a corrosion-resistant fluid such as Krytox®. In some embodiments, the vacuum pump comprises a fluid-free pump such as a diaphragm pump. In certain embodiments, a high-vacuum pump, such as a molecular drag pump (MDP in FIG. 1) or a turbomolecular pump is provided. The pump(s) may be protected by one or more traps. The traps may be fabricated from a transparent or translucent plastic such as PFA Teflon® and may contain a basic composition, such as pelletized NaOH, KOH, $Ca(OH)_2$, $CaCO_3$, a combination thereof, or the like. In certain embodiments, one or more traps is cooled to low temperature during operation, for example, dry ice temperature, liquid nitrogen temperature, or liquid oxygen temperature.

One or more bubblers, at least two of which may be connected in series, may be fabricated from a transparent or translucent plastic, such as Nalgene, polypropylene, polyethylene, perfluoroalkoxy (PFA) Teflon®, or the like. One or more of the bubblers may comprise a basic aqueous solution containing at least one of NaOH, KOH, $Na_2CO_3$, $NaHCO_3$, or the like.

The one more transfer vessels (vessels "A" and "B" in FIG. 1) may comprise a transparent or translucent plastic, such as perfluoroalkoxy (PFA) Teflon®. The transfer vessel may have an entrance tube above the body of the vessel with an inner diameter less than about 5 millimeters, less than about 3 millimeters, less than about 2 millimeters, or less than about 1 millimeter. The transfer vessel and/or the entrance tube above it may have one or more markings or measurement lines enabling reading of the height of a meniscus of a fluid contained therein. In certain embodiments at least one transfer vessel is fabricated from stainless steel (e.g., the vessel labeled "Bubbler" in FIG. 1), Hastalloy®, or another metallic composition.

A source of a condensable mineralizer composition, such as HF, may be connected to the manifold. A source of purge gas, such as argon (Ar) or nitrogen ($N_2$), may be connected to the manifold. Prior to use, the manifold may be verified to be gas-tight by helium leak-testing or the like.

The manifold may further comprise one or more sensors. Suitable sensors may include one or more of pressure sensors, such as a vacuum gauge, temperature sensors, such as thermocouples, and gas composition sensors, such as a mass spectrometer or residual gas analyzer. The sensors may be placed within or proximate to the manifold, and may communicate the process parameters within the manifold to a control system.

In certain embodiments, the manifold is filled with a purge gas (such as argon) between uses. The pressure of purge gas within the manifold prior to beginning the filling operation may be between about 0.1 atmosphere and about 5 atmospheres. In alternative embodiments, the manifold is left under vacuum between uses. The vacuum level within the manifold prior to beginning the filling operation may be below about 1 torr, below about 1 millitorr, or below about $10^{-5}$ torr.

A receiving vessel may be attached to the manifold via a leak-tight connection. The receiving vessel may comprise a capsule suitable for ammonothermal crystal growth, such as are described in U.S. Application Publication No. 2009/0201388, and may comprise a fill tube terminated by a valve that is closed when the receiving vessel or capsule is connected to the manifold. The receiving vessel may contain one or more group III metal nitride seed crystals, polycrystalline group III metal nitride nutrient, and one or baffles. In certain embodiments, the receiving vessel or capsule has been purged and/or evacuated prior to connection to the manifold. In certain embodiments, the receiving vessel or capsule has been baked out, at a temperature between about 50 degrees Celsius and about 800 degrees Celsius, prior to connection to the manifold. In certain embodiments, the receiving vessel or capsule is evacuated, purged, and/or baked out while connected to the manifold. In certain embodiments, purge gas is allowed to flow from the manifold into a fitting coupled to a valve on the receiving vessel while the attachment operation is being performed.

After connecting the receiving vessel or capsule to the manifold, with the valve on the fill tube of the receiving vessel closed, a valve terminating the connection of the manifold to the receiving vessel may be opened and at least a portion of the manifold plus the space between the manifold and the receiving vessel are evacuated. At least a portion of the manifold plus the space between the manifold and the receiving vessel may be back-filled with purge gas and re-evacuated. The back-fill/pump sequence may be repeated, for example, at least about 5 times. The manifold may be evacuated to a pressure below $10^{-3}$ Torr, below $10^{-4}$ Torr, below $10^{-5}$ Torr, below $10^{-6}$ Torr, below $10^{-7}$ Torr, below $10^{-8}$ Torr, or below $10^{-9}$ Torr. After the manifold, including at least one transfer vessel and the connection to the receiving vessel has achieved a desired vacuum level or has been purged and pumped a predetermined number of times, a valve to the vacuum pump may be closed.

A first transfer vessel may be chilled, for example, by immersion in a bath comprising dry ice and one of alcohol, acetone, or methylene chloride, or liquid nitrogen, or by means of a closed-cycle refrigerator. One or more valves between the source of a condensable mineralizer composition, such as HF, and the first transfer vessel is opened, and vapor from the condensable mineralizer composition is allowed to flow from the source vessel into the chilled first transfer vessel and allowed to condense. The pressure of vapor-phase condensable mineralizer composition may be between about 1 Torr and about 10 atmospheres during the transfer operation. In certain embodiments, the duration of the vapor transfer process is chosen by comparison of the level of the meniscus of the condensed mineralizer composition within the first transfer vessel to a reference position on the first transfer vessel. In certain embodiments, the source vessel containing the condensable mineralizer composition, such as a cylinder of HF, and the tubulation and valves connecting it to the first transfer vessel, are heated to a temperature between about 30 degrees Celsius and about 400 degrees Celsius, or between about 30 degrees Celsius and about 100 degrees Celsius, in order to facilitate the vapor phase transfer process. In certain embodiments, the vapor of the condensable mineralizer composition passes through a point-of-use purifier, which may comprise a getter, prior to condensing in the first transfer vessel. The point-of-use purifier may be heated, to a temperature between about 30 degrees Celsius and about 400 degrees Celsius, or between about 30 degrees Celsius and about 100 degrees Celsius, in order to facilitate the vapor phase transfer process. In certain embodiments, the first transfer vessel also contains a getter, for additional purification of the condensable mineralizer composition prior to transfer to the receiving vessel. In one specific embodiment the getter comprises at one of $CoF_2$, $ZnF_2$, $ZrF_4$, $HfF_4$, Hg, Cu, Ag, and Au.

After the desired amount of condensable mineralizer composition has been vapor-transferred to the first transfer vessel, one or more valves between the condensable mineralizer source vessel and the first transfer vessel may be closed. The first transfer vessel may then be warmed, for example, to room temperature.

In certain embodiments, it may be desirable to remove some of the condensable mineralizer composition from the first transfer vessel prior to transferring it to the receiving vessel. For example, measurement of the amount of condensable mineralizer composition may be accomplished volumetrically, comparing the height of the meniscus of the condensable mineralizer composition to one or more reference marks on the first transfer vessel or on the entrance tube above the first transfer vessel while the first transfer vessel is held at a predetermined temperature, for example, room temperature. One or more valves separating the first transfer vessel from a bubbler may be opened, and one or more valve to the purge gas may be opened, causing purge gas to flow over and within the first transfer vessel, mixing with vapor from the condensable mineralizer composition, and passing into the bubbler. In certain embodiments, one or more check valves prevents back-flow of gas or vapor from the bubbler into the manifold or from the manifold into the purge gas source line. The flow of purge gas may be terminated by closing one or more valves when the quantity of condensable mineralizer composition within the first transfer vessel has decreased to the desired level. In certain embodiments, a portion of the condensable mineralizer composition within the first transfer vessel is removed by partial evacuation, for example, by opening one or more values separating the first transfer vessel from a vacuum pump for a controlled period of time. In certain embodiments, the vacuum is protected from the corrosive condensable mineralizer composition by a trap, for example, pellets of at least one of sodium hydroxide, potassium hydroxide, calcium hydroxide, and calcium carbonate.

In certain embodiments, some or all of the condensable mineralizer composition is then transferred from the first transfer vessel to a second transfer vessel. In certain embodiments this transfer operation is carried out in the vapor phase, by chilling the second transfer vessel and, optionally, heating the first transfer vessel. In certain embodiments this transfer operation is carried out in the liquid phase, for example, by opening one or more valves and allowing the (liquid) condensable mineralizer composition to flow into the second transfer vessel. In certain embodiments, the amount of condensable mineralizer composition to be delivered to the receiving vessel is measured by comparing a position of the meniscus of the condensable mineralizer composition with one or more reference marks on the second transfer vessel or on the entrance tube above it. In certain embodiments, it may be desirable to remove some of the condensable mineralizer composition from the second transfer vessel prior to transferring it to the receiving vessel. One or more valves separating the second transfer vessel from a bubbler may be opened, and one or more valves to the purge gas may be opened, causing purge gas to flow over and within the second transfer vessel, mixing with vapor from the condensable mineralizer composition, and passing into the bubbler. The flow of purge gas may be terminated by closing one or more valves when the quantity of condensable mineralizer composition within the second transfer vessel has decreased to the desired level.

The transfer process of the condensable mineralizer composition may be repeated, for example, to a third, a fourth, or more transfer vessels. In some embodiments, one or more of the additional transfer processes are carried out via the vapor phase and via condensation.

In certain embodiments, the final transfer vessel upstream of the receiving vessel is configured for liquid-phase transfer of the condensable mineralizer composition to the receiving vessel. In one specific embodiment, an outlet tube on the final transfer vessel extends approximately to the bottom of the interior of the final transfer vessel. In another specific embodiment, the final transfer vessel is configured with a valve on its bottom end, so that the condensable mineralizer composition can flow into the receiving vessel when the valve is opened.

When the desired quantity of condensable mineralizer composition is contained within the final transfer vessel, upstream valves are closed, one or more valves separating the final transfer vessel from the receiving vessel are opened, and the condensable mineralizer composition is transferred from the final transfer vessel to the receiving vessel. In certain embodiments the receiving vessel is chilled to facilitate the transfer. In certain embodiments the final transfer vessel and the valves and line(s) connecting the final transfer vessel to the receiving vessel are heated to facilitate the transfer. In certain embodiments, the vapor pressure of condensable mineralizer composition in the final transfer vessel causes liquid-phase transfer of most of the condensable mineralizer composition from the final transfer vessel to the receiving vessel.

The quantity of condensable mineralizer composition transferred to the receiving vessel may be between about 0.1 milliliter and about 100 liters, or between about 1 milliliter and about 10 liters. Transfer of quantities larger than about 10 milliliters is facilitated by heating one or more vessels and tubulation during vapor-phase transfer to maintain a vapor pressure of the condensable mineralizer composition above atmospheric pressure.

After transfer of the condensable mineralizer composition to the receiving vessel is complete, the valves between the final transfer vessel and the receiving vessel may be closed and the connection between the two valves opened. Residual condensable mineralizer composition remaining within the manifold may be removed by passing purge gas through the manifold and into the bubbler, followed by evacuation and back-filling cycles with purge gas. The manifold may then be left filled with a predetermined pressure of purge gas or under vacuum.

This approach offers a number of advantages over prior-art methods. The intentional vapor transfer and re-condensation enable accurate metering of the condensable mineralizer composition without having to rely on a mass flow controller, whose calibration factor for the condensable mineralizer composition may not be known, and avoids unintentional condensation and clogging of a transfer line, as might occur with a simple vapor-phase transfer process such as that described by Mikawa et al. The distillation process itself provides additional purification, as the vapor pressures of the condensable mineralizer composition and potential impurities such as $O_2$ and $H_2O$ will be substantially different. In addition, getters can be added to a transfer vessel for purification without fear of contamination of the downstream process, as long as the getter and its reaction products with oxygen or other undesired impurities are non-volatile. Commercial grades of condensable mineralizer compositions such as HF and $GaCl_3$ typically contain at least a few parts per million and up to a percent or more of impurities such as $O_2$, $H_2O$, plus metals, and additional purification is therefore highly desirable.

Rigorous exclusion of air and moisture from the manifold enables higher purity mineralizer and avoids corrosion of the interior surfaces of the manifold by the condensable mineralizer composition. Removal of the large majority of undesired condensable mineralizer composition by flowing purge gas rather than evacuation greatly extends the life of the vacuum pump(s) and avoids pumpdown issues associated with buildup of condensable vapors within the pump oil. Use of a basic composition such as an alkali hydroxide in traps and bubblers protects the pump(s) against undesirable exposure to the condensable mineralizer composition and minimizes or avoids release of the condensable mineralizer composition to ambient air.

In certain embodiments, one or more additional mineralizer compositions may be added to the receiving vessel or capsule, including HCl, HBr, HI, $Cl_2$, $Br_2$, $I_2$, $GaCl_3$, $GaBr_3$, and $GaI_3$. In certain embodiments, the additional mineralizer compositions are transferred by vapor-phase transport, with condensation into at least one transfer vessel. In certain embodiments, the additional mineralizer compositions may be transferred by vapor-phase transport directly into the receiving vessel or capsule, for example, using a mass flow controller to meter the quantify the amount of mineralizer composition transferred. In certain embodiments, the additional mineralizer composition is transferred as a liquid.

In certain embodiments, following transfer of a predetermined and precisely-metered quantity of condensable mineralizer composition to the receiving vessel or capsule, ammonia may be transferred to the capsule after connecting the receiving vessel or capsule to a manifold for ammonia delivery. In certain embodiments, the ammonia manifold is a component of an integrated manifold that also comprises the manifold for transfer of the condensable mineralizer composition. In certain embodiments, ammonia is transferred into the receiving vessel or capsule by a vapor-phase transfer process. In certain embodiments, ammonia is transferred by a liquid-phase transfer process. Additional details of potential ammonia filling processes are described in U.S. Pat. No. 8,021,481, which is hereby incorporated by reference in its entirety.

Following removal of the receiving vessel or capsule from the manifold, it may be warmed up to room temperature. In certain embodiments, a fill tube connecting the body of the receiving vessel or capsule to a valve is welded closed.

In certain embodiments, mineralizer formation processes may occur spontaneously or after additional processing. For example, formation of one or more of $NH_4F$ and $NH_5F_2$ may occur spontaneously upon addition of $NH_3$ to a receiving vessel containing HF, either directly at low temperature or after warming. $GaX_3$ (where X=F, Cl, Br, or I) may similarly form one or more complexes upon addition of $NH_3$. The rate of such formation reactions may be controlled by slow addition of gas-phase $NH_3$ to a receiving vessel containing HF, for example, at rates below about 5 standard liters per minute (SLM) or below about 1 SLM until formation of the reaction product is complete. Additional mineralizer formation reactions may occur at elevated temperatures, for example, formation of one or more of $GaF_3 \cdot 2NH_3$ and $(NH_4)_3GaF_6$ by reaction of $NH_4F$ and $NH_3$ with a group III metal nitride.

The control system for the manifold may include a controller, a processor in communication with the controller, and a wired or wireless communication system that allows the controller to communicate with sensors, valves, sources, monitoring and evaluating equipment, and the like.

The sensors within the manifold may sense conditions within the manifold and/or the transfer or receiving vessel, such as the temperature, pressure, and/or gas concentration and composition, and may signal information to the controller. Flow rate monitors may signal information about the flow rate through the corresponding inlet or outlet to the controller. The controller (via the processor) may respond to the information received, and may control devices in response to the information and pre-determined instruction parameters. For example, the controller may signal the energy source to provide thermal energy to the furnace. The controller may signal one or more valves to open, close, or open to a determined flow level during the course of mineralizer synthesis. The controller may be programmed to implement a method of synthesizing purified mineralizer compositions according to embodiments of the disclosure.

The ultrapure mineralizer has a total oxygen concentration, including adsorbed moisture, hydrates, and chemically-bonded oxides, less than about 100 parts per million by weight. In certain embodiments, the oxygen concentration within the purified mineralizer is less than about 10 parts per million, less than about 5 parts per million, less than about 2 parts per million, or less than about 1 part per million. The ultrapure mineralizer may also have a purity, on a trace metals basis, that is greater than greater than 99%, greater than 99.9%, greater than 99.99%, greater than 99.999%, or greater than 99.9999%. The ultrapure mineralizer may also have a total concentration of other light main group elements, such as boron, carbon, silicon, phosphorus, and sulfur, that is less than 10 parts per million, less than 1 part per million, or less than 0.1 part per million.

Figure 2:
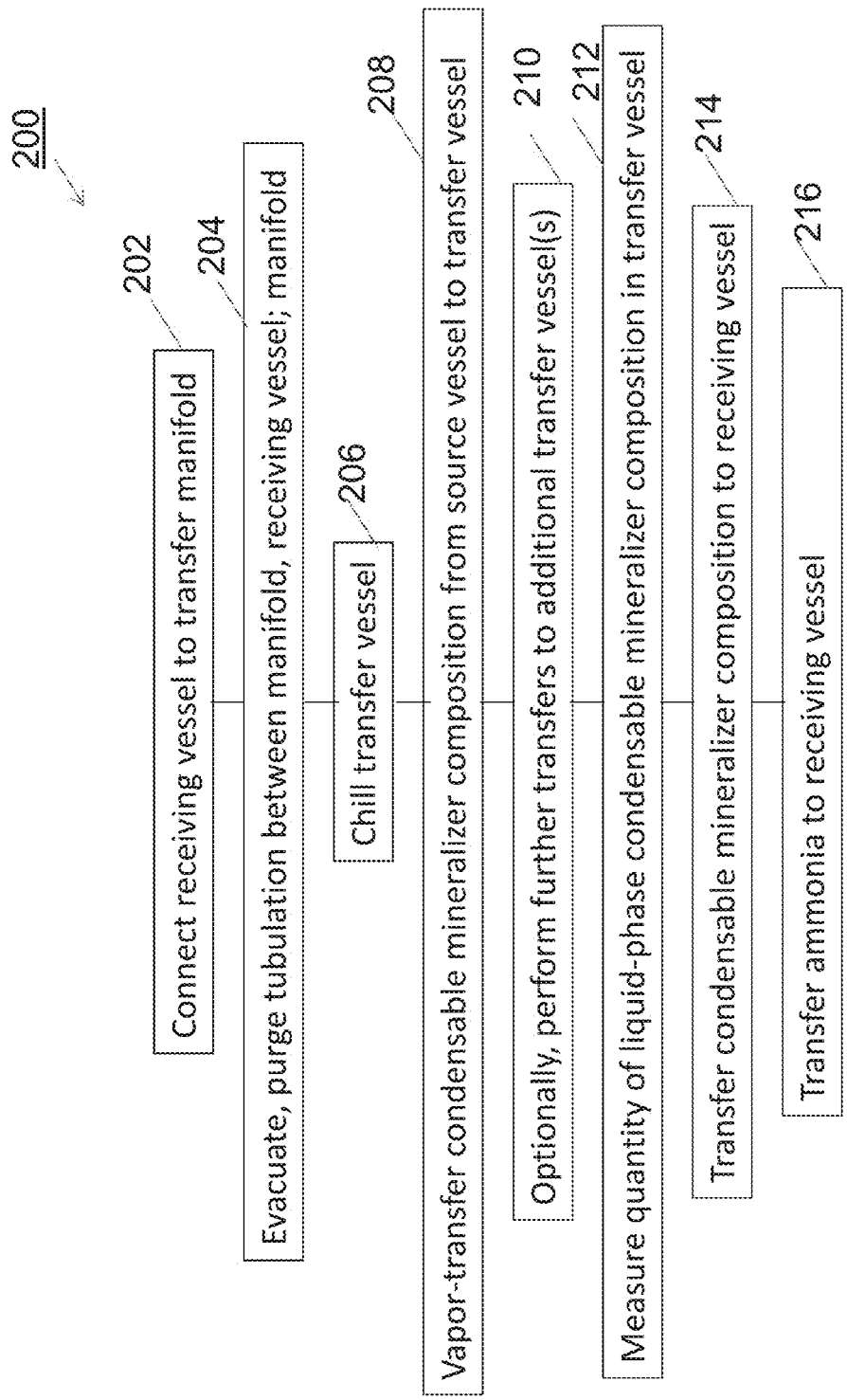
FIG. 2 is a flowchart summarizing synthesis of a composition according to an embodiment of the present disclosure.

A simplified flow diagram 200 for synthesis of an ultrapure mineralizer is shown in FIG. 2. This diagram is merely an example and should not unduly limit the claims herein. One skilled in the art would recognize other modifications, variations, and alternatives. In step 202, a receiving vessel is connected to the mineralizer transfer manifold with a leak-tight seal. In step 204, the tabulation and/or space encompassed by the new connection is evacuated and purged, along with further evacuation and purging of additional portions of the manifold. In step 206, the first transfer vessel is chilled. In step 208, a quantity of condensable mineralizer composition is transferred in the vapor phase from the source vessel to the first transfer vessel. In step 210, optionally, at least a portion of the condensable mineralizer composition is transferred to one or more additional transfer vessels. In step 212, the quantity of condensable mineralizer composition in at least one transfer vessel is measured and, if necessary, adjusted to a predetermined level. In step 214, the condensable mineralizer composition from the final transfer vessel is transferred to the receiving vessel. In certain embodiments, the pressure within the manifold is maintained below a pressure of about one to about three atmospheres.

Surprisingly, the methods described herein provide reliable, accurate means for delivery of an ultrapure mineralizer to a receiving vessel for ammonothermal crystal growth. It is common practice within the semiconductor industry to utilize vacuum systems and gas manifolds of all-metal construction, such as all-stainless-steel and to control gas flows exclusively using mass flow controllers. For example, the mineralizer synthesis method described by Mikawa et al. generally follows these procedures. By contrast, the inventive method may utilize plastic as well as metal compositions and volumetric methods, which are commonly regarded as being insufficiently accurate for semiconductor-grade operations. For example, the use of both metal and plastic components in a vacuum system or gas manifold implies the need for metal-to-plastic seals, which are commonly regarded as unreliable and prone to leaks. Surprisingly, we find that the gas-to-plastic seals in the inventive manifold can be run reliably, albeit with regular preventive maintenance, that mineralizer volume to can be measured to better than 5%, better than 2%, or better than 1% accuracy, by means of simple volumetric methods. As noted previously, these volumetric methods avoid potential calibration issues with mass flow controllers. In addition, these methods avoid clogging issues that are common when working with condensable vapors, particularly with low-conductance components such as point-of-use purifiers.

In some embodiments, the mineralizer is used as a raw material for ammonothermal growth of at least one group III metal nitride single crystal. A capsule containing the ultrapure mineralizer and ammonia is placed within an autoclave or within an internally-heated high pressure apparatus, as described, for example, in U.S. Pat. No. 8,021,481 and in U.S. Application Publication No. 2010/0031875 and U.S. patent application Ser. No. 13/472,356. In the case of use in an autoclave, the space between the capsule and the inner diameter of the autoclave may be filled with ammonia to a similar volume percent as that within the capsule to as to generate a similar pressure on the exterior of the capsule as that within the interior of the autoclave upon heating, thereby minimizing deformation of the capsule (so-called pressure-balance method, as known in the art). After all the raw materials have been added to the autoclave or high pressure apparatus, the autoclave or high pressure apparatus is sealed.

The polycrystalline group III metal nitride is then processed in supercritical ammonia at a temperature greater than about 400 degrees Celsius and a pressure greater than about 50 megapascal (MPa), during which at least a portion of the polycrystalline group III metal nitride is etched away and recrystallized onto at least one group III metal nitride crystal having a wurtzite structure. In some embodiments, the polycrystalline group III metal nitride is processed in supercritical ammonia at a temperature greater than about 500 degrees Celsius, greater than about 550 degrees Celsius, greater than about 600 degrees Celsius, greater than about 650 degrees Celsius, greater than about 700 degrees Celsius, or greater than about 750 degrees Celsius. In some embodiments, the polycrystalline group III metal nitride is processed in supercritical ammonia at a pressure greater than about 100 MPa, greater than about 200 MPa, greater than about 300 MPa, greater than about 400 MPa, greater than about 500 MPa, or greater than about 600 MPa.

After performing crystal growth for a predetermined period of time, the autoclave or high-pressure apparatus is cooled. When the autoclave or capsule has cooled to below about 100 degrees Celsius, below about 75 degrees Celsius, below about 50 degrees Celsius, or below about 35 degrees Celsius, a valve to the autoclave is opened and/or the capsule is vented, and the ammonia is removed. In certain embodiments, gas-phase ammonia is allowed to exit the autoclave or capsule and is bubbled through an acidic aqueous solution in order to be chemically trapped. In certain embodiments, gas phase ammonia is passed through a flame so as to burn the ammonia, forming $H_2O$ and $N_2$. In certain embodiments, the ammonia is collected for purification and re-use.

After cooling, removal of the ammonia, and opening of the autoclave or internally-heated high-pressure apparatus and capsule, the grown crystals, or boules, are removed from the capsule or autoclave.

One or more wafers may be prepared from an as-grown boule using a single- or multi-wire saw, an inner-diameter saw, an outer-diameter saw, or the like. Prior to sawing, the boule may be precisely oriented using an x-ray goniometer, so as to prepare wafers with a pre-determined miscut angle. After slicing, the crystal wafers may be lapped, polished, and chemical-mechanically polished by methods that are known in the art. In some embodiments, the dislocation density at the large-area surfaces of the wafers is less than about $10^7$ cm$^{-2}$, less than about $10^6$ cm$^{-2}$, less than about $10^5$ cm$^{-2}$, less than about $10^4$ cm$^{-2}$, less than about $10^3$ cm$^{-2}$, or less than about $10^2$ cm$^{-2}$. In some embodiments, the full width at half maximum of the x-ray diffraction line corresponding to the crystallographic orientation of the large-area face is less than 300 arc seconds, less than 150 arc seconds, less than 100 arc seconds, less than 50 arc seconds, less than 40 arc seconds, less than 30 arc seconds, or less than 20 arc seconds.

Figure 3:
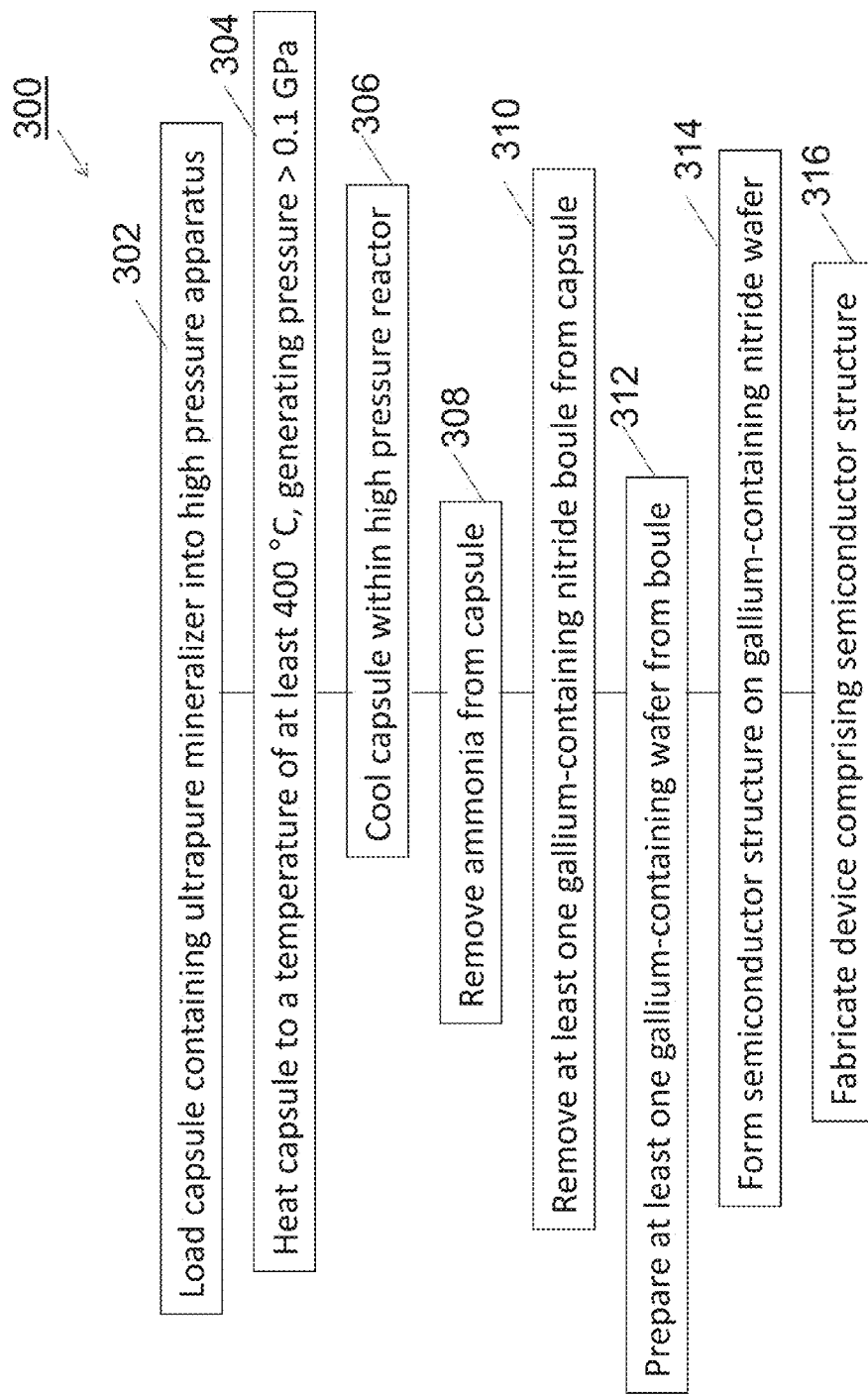
FIG. 3 is a flowchart summarizing utilization of a composition according to an embodiment of the present disclosure.

FIG. 3 depicts a block diagram of a system for growth of a group III metal nitride crystal using the ultrapure mineralizer disclosed herein.

As shown, the method of system 300 commences at a step 302 to load a capsule, filled with predetermined quantities of ultrapure mineralizer and ammonia, into a high pressure apparatus, such as an autoclave or an internally-heated high pressure reactor. In step 304, the capsule is heated to temperature above about 400 Celsius, generating an internal pressure greater than about 0.1 GPa. In step 306 the capsule within the high pressure reactor is cooled. In step 308 the ammonia is removed from the capsule. In step 310 at least one group III metal nitride boule is removed from the capsule. In step 312, at least one group III metal nitride wafer is prepared from the at least one group III metal nitride boule. In step 314, a semiconductor structure is formed on the group III metal nitride wafer, for example, comprising an $In_xAl_yGa_{1-x-y}N$ active layer, where $0 \le x$, y, $x+y \le 1$. In step 316, a device comprising the semiconductor structure is fabricated, for example, at least one of a light-emitting diode, a laser diode, a diode, a sensor, or a transistor.

The group III metal nitride crystal wafers are useful as substrates for fabrication into semiconductor structures and, further, into optoelectronic and electronic devices such as at least one of a light emitting diode, a laser diode, a photodetector, an avalanche photodiode, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for a photoelectrochemical water splitting and hydrogen generation device.

While the above is a full description of the specific embodiments, various modifications, alternative constructions and equivalents may be used. Therefore, the above description and illustrations should not be taken as limiting the scope of the present disclosure which is defined by the appended claims.

Still further embodiments support the method of making and method of use of the ultrapure mineralizer disclosed herein. Any of the embodiments below can be practiced in a variety of variations:

Embodiment 1

An apparatus for forming an ultrapure mineralizer composition for ammonothermal crystal growth of a group III metal nitride crystal, comprising:
tubulation and valves, comprising a manifold; a first transfer vessel; a second transfer vessel, wherein means are provided for quantitative transfer of a liquid from the second transfer vessel to a receiving vessel; and means for flowing a purge gas into the manifold, evacuation of the manifold, and venting of gas into an exhaust treatment system.

Embodiment 2

The apparatus of embodiment 1, wherein at least one transfer vessel comprises a transparent or translucent plastic.

Embodiment 3

The apparatus of embodiment 1, further comprising a molecular drag vacuum pump

What is claimed is:

1. A method for growth of group III metal nitride crystals, comprising:
providing a manifold comprising at least one first transfer vessel, a source vessel containing a condensable mineralizer composition, and a receiving vessel;
chilling the at least one first transfer vessel;
transferring a quantity of the condensable mineralizer composition to the at least one first transfer vessel via a vapor phase and causing condensation of the condensable mineralizer composition within the at least one first transfer vessel;
measuring the quantity of the condensable mineralizer composition within the at least one transfer vessel;
transferring the condensable mineralizer composition to the receiving vessel; and
utilizing the transferred condensable mineralizer composition or a composition formed from the condensable mineralizer composition as a mineralizer for ammonothermal crystal growth of a group III metal nitride boule, the ammonothermal crystal growth being performed at a temperature of at least about 400 degrees Celsius.

2. The method of claim 1, wherein a transferred quantity of the condensable mineralizer composition within the at least one first transfer vessel is determined volumetrically.

3. The method of claim 1, further comprising adjusting a quantity of condensable mineralizer composition within the at least one first transfer vessel by passing purge gas over the condensable mineralizer composition within the at least one first transfer vessel, or by partially evacuating the condensable mineralizer composition within the at least one first transfer vessel.

4. The method of claim 1, wherein the condensable mineralizer composition comprises fluorine.

5. The method of claim 4, wherein the condensable mineralizer composition comprises HF, which is subsequently reacted with added $NH_3$ to form at least one of $NH_4F$ and $NH_5F_2$.

6. The method of claim 4, further comprising transferring a second mineralizer composition comprising at least one of chlorine, bromine, or iodine to the receiving vessel.

7. The method of claim 1, further comprising transferring at least a portion of the condensable mineralizer composition from the at least one first transfer vessel to a second transfer vessel.

8. The method of claim 1, further comprising passing the condensable mineralizer composition through a point-of-use purifier, performing at least a second vapor phase transfer and a second condensation, or a combination thereof.

9. The method of claim 1, further comprising exposing the condensable mineralizer composition to a getter in the at least one first transfer vessel.

10. The method of claim 1, wherein the condensable mineralizer composition within the receiving vessel comprises a total oxygen content less than about 100 parts per million (ppm) by weight.

11. The method of claim 10, wherein the condensable mineralizer composition within the receiving vessel comprises a total oxygen content less than about 5 parts per million (ppm) by weight.

12. The method of claim 1, further comprising evacuating the manifold.

13. The method of claim 12, wherein evacuating is carried out at least in part through a trap comprising a basic composition.

14. The method of claim 12, wherein evacuating is carried out at least in part using a molecular drag pump.

15. The method of claim 1, wherein at least one transfer vessel comprises a transparent plastic or a translucent plastic.

16. The method of claim 1, wherein at least one transferring operation is carried out at a vapor pressure of the condensable mineralizer composition greater than one atmosphere.

17. The method of claim 1, wherein transferring the condensable mineralizer composition to the receiving vessel is performed predominantly in a liquid phase.

18. The method of claim 1, further comprising forming at least one group III metal nitride wafer from the group III metal nitride boule grown ammonothermally.

19. The method of claim 18, further comprising forming a semiconductor structure on the group III metal nitride wafer, the semiconductor structure comprising an $In_xAl_yGa_{1-x-y}N$ active layer, wherein $0 \leq x, y,$ and $x+y \leq 1$.

20. The method of claim 19, further comprising incorporating the semiconductor structure into a device, the device comprising at least one of a light emitting diode, a laser diode, a photodetector, an avalanche photodiode, a transistor, a rectifier, a thyristor, a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascade switch, an inner sub-band emitter, a quantum well infrared photodetector, a quantum dot infrared photodetector, a solar cell, and a diode for a photoelectrochemical water splitting and hydrogen generation device.

\* \* \* \* \*